(12) United States Patent
Bian (10) Patent No.: US 10,930,727 B2
(45) Date of Patent: Feb. 23, 2021

(54) ORGANIC LIGHT-EMITTING DIODE DISPLAY SCREEN AND ELECTRONIC DEVICE

(71) Applicant: Beijing Xiaomi Mobile Software Co., Ltd., Beijing (CN)

(72) Inventor: Qingfang Bian, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/508,919

(22) Filed: Jul. 11, 2019

(65) Prior Publication Data

US 2020/0098844 A1    Mar. 26, 2020

(30) Foreign Application Priority Data

Sep. 21, 2018 (CN) .......................... 201811109061.6

(51) Int. Cl.
   *H01L 27/32* (2006.01)

(52) U.S. Cl.
   CPC ...... *H01L 27/3276* (2013.01); *H01L 27/3206* (2013.01); *H01L 27/3258* (2013.01)

(58) Field of Classification Search
   CPC ........................ H01L 27/3206; H01L 27/3258
   See application file for complete search history.

(56) References Cited

U.S. PATENT DOCUMENTS

| | | |
|---|---|---|
| 9,263,704 B2 | 2/2016 | Yoo et al. |
| 10,096,671 B2 | 10/2018 | Oh et al. |
| 2005/0269946 A1* | 12/2005 | Jeong ................. H01L 27/3258 313/504 |
| 2008/0218061 A1 | 9/2008 | Chao et al. |
| 2011/0205198 A1 | 8/2011 | Jeong et al. |
| 2015/0188095 A1 | 7/2015 | Yoo et al. |
| 2017/0294155 A1* | 10/2017 | Kim ................... H01L 27/3248 |
| 2018/0005007 A1 | 1/2018 | Du et al. |
| 2018/0006106 A1 | 1/2018 | Oh et al. |

(Continued)

FOREIGN PATENT DOCUMENTS

| | | |
|---|---|---|
| CN | 104201188 A | 12/2014 |
| CN | 104752482 A | 7/2015 |

(Continued)

OTHER PUBLICATIONS

Extended European Search Report dated Feb. 10, 2020, in counterpart European Application No. 19194345.5-1211.

(Continued)

*Primary Examiner* — Jay C Chang
*Assistant Examiner* — Mikka Liu
(74) *Attorney, Agent, or Firm* — Finnegan, Henderson, Farabow, Garrett & Dunner, L.L.P.

(57) ABSTRACT

An organic light-emitting diode (OLED) display screen and an electronic device are provided. The OLED display screen includes, in a first direction, a first region and a second region. A first film layer in the first region of the display screen is provided with one or more driving elements, and the first film layer in the second region of the display screen is provided with no driving element. One or more first light-emitting elements arranged in the first region and one or more second light-emitting elements arranged in the second region are driven by the one or more driving elements in the first region.

17 Claims, 4 Drawing Sheets

(56) References Cited

U.S. PATENT DOCUMENTS

2019/0012542 A1  1/2019  Zhou
2019/0067396 A1  2/2019  Cheng et al.

FOREIGN PATENT DOCUMENTS

| CN | 107133613 A | 9/2017 |
|---|---|---|
| CN | 107330415 A | 11/2017 |
| CN | 108010945 A | 5/2018 |
| CN | 108336107 A | 7/2018 |
| FR | 2999018 B1 | 1/2016 |
| KR | 10-2012-0062178 A | 6/2012 |
| KR | 20160063232 A | 6/2016 |
| KR | 20170115923 A | 10/2017 |
| RU | 2473137 C2 | 1/2013 |
| RU | 2656814 C2 | 6/2018 |

OTHER PUBLICATIONS

Notice of Allowance issued by the Federal Service for Intellectual Property, Patents and Trademarks (ROSPATENT) dated Mar. 5, 2020, in counterpart Russian Application No. 2019130157/28.
Korean Office Action dated Oct. 8, 2020, in counterpart Korean Application No. 10-2019-7027155.

* cited by examiner

ORGANIC LIGHT-EMITTING DIODE DISPLAY SCREEN AND ELECTRONIC DEVICE

CROSS-REFERENCE TO RELATED APPLICATION

The present application is based upon and claims priority to Chinese Application No. 201811109061.6, filed on Sep. 21, 2018, the contents of which are hereby incorporated by reference in its entirety.

TECHNICAL FIELD

The present disclosure relates to the technical field of electronic devices, and more particularly, to an organic light-emitting diode (OLED) display screen and an electronic device.

BACKGROUND

An OLED may also be called an organic electroluminescence display or an organic light-emitting semiconductor. An OLED display screen is a display screen made of OLEDs. Due to excellent properties of no need for backlight sources, high contrast, small thickness and the like, the OLED display screen is widely applied to various electronic devices, for example, various mobile terminals. With development of mobile terminal technologies, areas of display screens of mobile terminals become larger, which may block devices such as cameras of the mobile terminals. In the related art, a hole may be formed in a position, corresponding to the camera, of the display screen to solve the problem of blocking. However, formation of the hole in the display screen may reduce a display area of the screen, reduce a mechanical strength of the mobile terminal and it is not conductive to dust proofing and water proofing.

SUMMARY

In order to solve the problems in the related art, the present disclosure provides an OLED display screen and an electronic device.

According to a first aspect of embodiments of the present disclosure, an OLED display screen is provided. The OLED display screen includes, in a first direction, a first region and a second region and, in a second direction perpendicular to the first direction, a first film layer, and a first electrode, a second film layer, and a second electrode which are sequentially overlaid on the first film layer. The first film layer in the first region of the OLED display screen is provided with one or more driving elements, and the first film layer in the second region of the OLED display screen is provided with no driving element. One or more first light-emitting elements are arranged in the second film layer in the first region of the OLED display screen, and one or more second light-emitting elements are arranged in the second film layer in the second region of the OLED display screen. The one or more first light-emitting elements and the one or more second light-emitting elements are driven by the one or more driving elements to emit light. The one or more first light-emitting elements and the one or more second light-emitting elements are electrically connected to the one or more driving elements through the first electrode. The one or more first light-emitting elements and the one or more second light-emitting elements are electrically connected to the second electrode.

According to a second aspect of the embodiments of the present disclosure, an electronic device is provided, which includes the OLED display screen based on the above description.

The technical solutions according to the embodiments of the present disclosure may include the following beneficial effects. According to the present disclosure, the OLED display screen includes, in the first direction, the first region and the second region. The first film layer in the first region of the OLED display screen is provided with the one or more driving elements, and the first film layer in the second region of the OLED display screen is provided with no driving element. The one or more first light-emitting elements arranged in the first region and one or more second light-emitting elements arranged in the second region are driven by the one or more driving elements in the first region. Therefore, no driving element is required to be arranged in the second region, thereby transparency of the second region can be greatly increased, lighting of a device behind the second region can be facilitated, formation of a via in the OLED display screen can be avoided, a display effect of the second region can also be achieved, no additional driving signal line and driving element are required to drive the one or more second light-emitting elements to emit light, and the OLED display screen is simple in structure.

It is to be understood that the above general description and detailed description below are only exemplary and explanatory, and not intended to limit the present disclosure.

BRIEF DESCRIPTION OF THE DRAWINGS

The accompanying drawings, which are incorporated in and constitute a part of this specification, illustrate embodiments consistent with the present disclosure, and serve to explain the principle of the present disclosure together with the description.

DETAILED DESCRIPTION

Exemplary embodiments will be explained in detail herein, examples of which are illustrated in the accompanying drawings. The following description refers to the accompanying drawings in which the same numbers in different drawings represent the same or similar elements unless otherwise represented. The implementations described in the following exemplary embodiments do not represent all the implementations consistent with the present disclosure. Instead, they are merely examples of apparatuses and methods consistent with aspects of the present disclosure.

Figure 1:
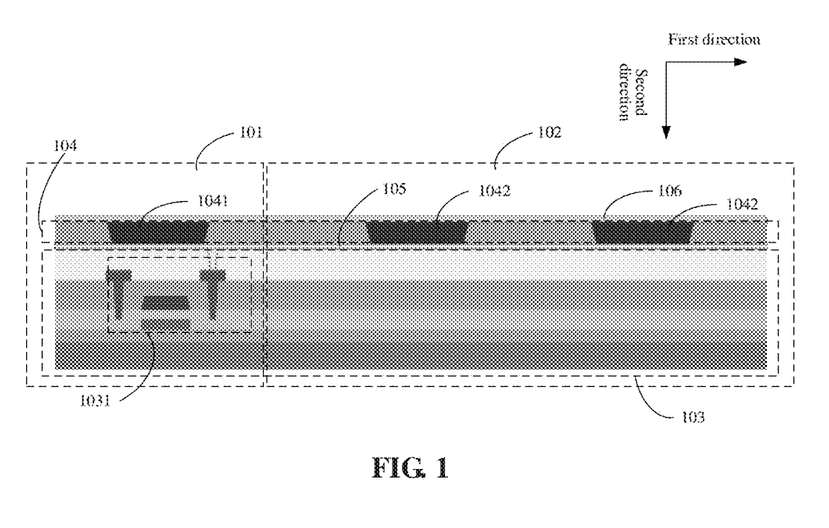
FIG. 1 is a schematic sectional view illustrating an OLED display screen in a second direction according to an exemplary embodiment.

FIG. 1 is a schematic sectional view of an OLED display screen in a second direction according to an exemplary embodiment. As illustrated in FIG. 1, the display screen includes, in a first direction, a first region 101 and a second region 102, and the display screen includes, in a second direction perpendicular to the first direction, a first film layer 103, as well as a first electrode 105, a second film layer 104 and a second electrode 106 which are sequentially overlaid on the first film layer.

The first film layer 103 in the first region 101 of the display screen is provided with a driving element 1031, and the first film layer 103 in the second region 102 of the display screen is provided with no driving element 1031.

A first light-emitting element 1041 is arranged in the second film layer 104 in the first region 101 of the display screen, and a second light-emitting element 1042 is arranged in the second film layer 104 in the second region 102 of the display screen. The first light-emitting element 1041 and the second light-emitting element 1042 are driven by the driving element 1031 to emit light.

The first light-emitting element 1041 and the second light-emitting element 1042 are both electrically connected to the driving element 1031 through the first electrode 105.

The first light-emitting element 1041 and the second light-emitting element 1042 are both electrically connected to the second electrode 106.

In the embodiment illustrated in FIG. 1, the display screen may include, in the first direction, the first region 101 and the second region 102. Correspondingly, the driving element 1031 may be arranged in the first film layer 103 in the first region 101 of the display screen, and may be, for example, a thin film transistor (TFT). Also, no driving element 1031 may be arranged in the first film layer 103 in the second region 102 of the display screen. Therefore, transparency of the second region can be increased. The first electrode 105 may be overlaid on the first film layer 103. The first electrode 105 may extend across the first region 101 and the second region 102 and may be electrically connected to the driving element 1031 through a via formed on the driving element 1031 in the first film layer 103. The second film layer 104 may be overlaid on the first electrode 105. The first light-emitting element 1041 may be arranged in the second film layer 104 in the first region 101 of the display screen, and the second light-emitting element 1042 may be arranged in the second film layer 104 in the second region 102 of the display screen. The first light-emitting element 1041 and the second light-emitting element 1042 may both be electrically connected to the first electrode 105. In such a manner, the first electrode 105 may transmit an electrical driving signal emitted from the driving element 1031 to the first light-emitting element 1041 and the second light-emitting element 1042, respectively, to drive the first light-emitting element 1041 and the second light-emitting element 1042 to emit light.

According to the present disclosure, the display screen includes, in the first direction, the first region and the second region. The first film layer in the first region of the display screen is provided with one or more driving elements, and the first film layer in the second region of the display screen is provided with no driving element. One or more first light-emitting elements arranged in the first region and one or more second light-emitting elements arranged in the second region are driven by the one or more driving elements in the first region. Therefore, no driving element is required to be arranged in the second region, thereby transparency of the second region can be greatly increased, lighting of a device behind the second region can be facilitated, formation of a via in the display screen can be avoided, a display effect of the second region can also be achieved, no additional driving signal line and driving element are required to drive the one or more second light-emitting elements to emit light, and the display screen is simple in structure.

In an embodiment, the first region may include multiple first light-emitting elements and multiple third light-emitting elements. A light-emitting principle of the third light-emitting element may be the same as that of the first light-emitting element and the second light-emitting element. Each third light-emitting element may be electrically connected to a driving element. The multiple third light-emitting elements may form multiple pixel points respectively and may be driven by the driving element electrically connected to the multiple third light-emitting elements to emit light, so that a multimedia file such as an image and a video can be displayed in the first region. The multiple first light-emitting elements may be sequentially arranged at an edge, adjacent to the second region, of the first region, so that a length of the first electrode can be reduced and structural redundancy of the display screen can be reduced. Multiple second light-emitting elements may be divided into multiple groups. At least one second light-emitting element in each group may be electrically connected to a first light-emitting element and a driving element through the first electrode. The driving element may drive the first light-emitting element and multiple second light-emitting elements electrically connected thereto to emit light respectively so that the second region has a display function.

In an embodiment, the display screen may include one or more first regions and one or more second regions, and an area of the first region and an area of the second region may be the same or different. A shape of each of the first region and the second region may include any shape such as a circle, a rectangle, a triangle and a polygon, which is not limited herein. A position relationship of the first region and the second region may include any one or more of the following: the second region is located at an edge of the first region, the first region surrounds the second region, or the second region surrounds the first region.

In an embodiment, the first film layer, the second film layer, the first electrode, the second electrode, the first light-emitting element and the second light-emitting element in the present disclosure may be made of materials with certain transparency respectively, and the transparency may be represented as the extent to which a substance allows light to pass through. In such a manner, since no driving element is arranged in the second region of the display screen in the present disclosure, when the first film layer, the second film layer, the first electrode, the second electrode and the second light-emitting element are all made of the materials with transparency, the second region can have a higher transparency.

For example, the first film layer may be a composite layer and a used material may include an inorganic material, such as silicon nitride and silicon oxide, and an organic material such as polyimide. A material of the first film layer in the first region of the display screen may be different from a material of the first film layer in the second region of the display screen. A material of the second film layer may include an organic material such as polyimide. The first electrode and the second electrode may be made of transparent conducting materials, for example, including transparent conducting oxide such as indium tin oxide (ITO) or indium-doped zinc oxide (IZO) or including a composite material of a transparent conducting oxide and a metal such as Ag. Materials of the first light-emitting element and the second light-emitting element may include, for example, a small molecular organic luminescent material or a macromolecular polymer luminescent material.

In an embodiment, the material of the second electrode may also include a metal material such as a magnesium-silver alloy. The second electrode may have a small thickness (which may be, for example, from 1 nanometer to 10 nanometers), so that the second electrode has a certain transparency.

It is to be noted that the description of the materials of the components of the display screen are only examples rather than limitation in the present disclosure. Those skilled in the art may select any other proper material according to needs as long as the material has a certain transparency. There are no specific limits made to the materials of the OLED display screen in the present disclosure.

Figure 2:
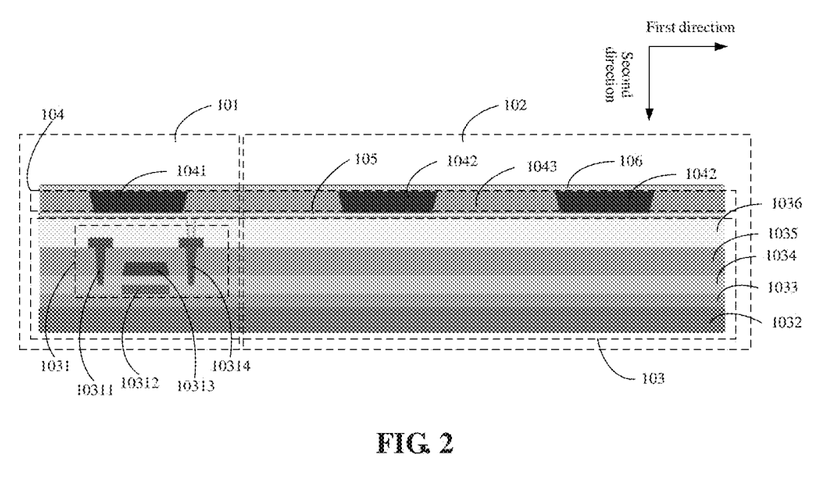
FIG. 2 is a schematic sectional view illustrating an OLED display screen in a second direction according to an exemplary embodiment.

FIG. 2 is a schematic sectional view of an OLED display screen in a second direction according to an exemplary embodiment. As illustrated in FIG. 2, the first film layer 103 may include a substrate (Glass) 1032, a buffer layer (Buffer) 1033, a gate insulating layer (GI) 1034, an interlayer dielectric layer (ILD) 1035 and a planar layer (PLN) 1036. The driving element 1031 may include a source 10311, a driving semiconductor layer 10312, a gate 10313 and a drain 10314. The second film layer 104 may include a pixel definition layer (PDL) 1043, the first light-emitting element 1041, and the second light-emitting element 1042.

In the embodiment illustrated in FIG. 2, the buffer layer 1033 may be overlaid on the substrate 1032. A material of the substrate 1032 may include an insulating material such as glass, quartz, ceramics or plastics and polyimide. A material of the buffer layer 1033 may include silicon nitride, silicon oxide and the like. The buffer layer 1033 may be used to prevent an unnecessary ingredient such as impurities or moisture from penetrating the substrate 1032 and to form a planar surface. The driving semiconductor layer 10312 of the driving element 1031 may be arranged on the buffer layer 1033. A material of the driving semiconductor layer 10312 may include polycrystalline silicon and a heavily doped region. The gate insulating layer 1034 covers the driving semiconductor layer and the buffer layer 1033, and a material of the gate insulating layer 1034 may include silicon nitride and the like. The source 10311, the gate 10313, and the drain 10314 are formed on the interlayer dielectric layer 1035. The source 10311 and the drain 10314 are electrically connected to the driving semiconductor layer 10312 through contact holes formed in the interlayer dielectric layer 1035 and the gate insulating layer 1034. The planar layer 1036 covers the interlayer dielectric layer 1035. The drain 10314 is electrically connected to the first electrode 105 arranged on the planar layer 1036 through a contact hole formed in the planar layer 1036.

The first light-emitting element 1041 and the second light-emitting element 1042 may be limited in the second film layer 104 by the pixel definition layer 1043 and may be electrically connected to the first electrode 105. Each of the first light-emitting element 1041 and the second light-emitting element 1042 may include, for example, one or more layers of an organic light-emitting layer, a hole injection layer (HIL), a hole transport layer (HTL), an electron transport layer (ETL), and an electron injection layer (EIL). Structures of the first light-emitting element 1041 and the second light-emitting element 1042 may be the same and may also be different.

As illustrated in FIG. 2, the second electrode 106 may be arranged on the second film layer 104. The first light-emitting element 1041 and the second light-emitting element 1042 may both be electrically connected to the second electrode 106.

In an embodiment, the first electrode 105 may be an anode and a material of the first electrode 105 may include, for example, ITO. The second electrode 106 may be a cathode, and a material of the second electrode 106 may include, for example, a magnesium-silver alloy.

It is to be noted that, the first film layer 103 where the driving element is located may include insulating layers such as the substrate, the buffer layer, the gate insulating layer, the interlayer dielectric layer and the planar layer, and may also include metal layers such as the gate, the source and the drain. Any one or more insulating layers or metal layers may be added or removed according to needs. There are no limits made to a specific structure of the first film layer 103, a type of the driving element 1031 and types of the first light-emitting element 1041 and the second light-emitting element 1042 in the present disclosure.

In an embodiment, a material of the first film layer 103 in the first region of the display screen may be different from a material of the first film layer in the second region of the display screen. For example, a via may be formed at the first film layer 103 in the second region of the display screen and may be filled with a material with a high transparency, such as polymethyl methacrylate (PMMA), so that the second light-emitting element can be supported, a mechanical strength of the screen can be improved and the transparency of the second region can further be increased.

In an embodiment, a thickness of the first film layer 103 in the first region of the display screen may be different from a thickness of the first film layer 103 in the second region of the display screen. For example, the thickness of the first film layer 103 in the second region of the display screen may be smaller than the thickness of the first film layer 103 in the first region of the display screen, so that the transparency of the second region of the display screen can be effectively increased.

In an embodiment, a via may be formed at the first film layer 103 in the second region of the display screen. The transparency of the second region of the display screen can further be increased.

Figure 3:
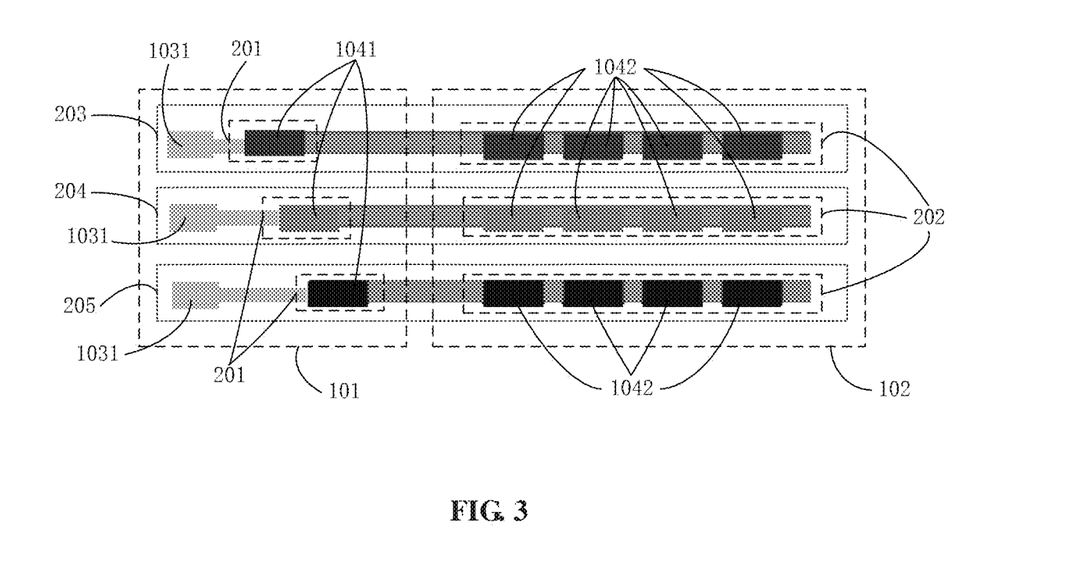
FIG. 3 is a schematic diagram illustrating an OLED display screen in a first direction according to an exemplary embodiment.

FIG. 3 is a schematic diagram illustrating an OLED display screen in a first direction according to an exemplary embodiment. As illustrated in FIG. 3, the display screen may include multiple first light-emitting elements 1041 and multiple second light-emitting elements 1042.

The multiple first light-emitting elements 1041 are divided into multiple first groups, and each of the multiple first groups may include at least one first light-emitting element 1041.

The multiple second light-emitting elements 1042 are divided into multiple second groups, and each of the multiple second groups includes at least one second light-emitting element 1042.

Each second group corresponds to a respective one of the first groups.

The at least one second light-emitting element 1042 in each second group and the at least one first light-emitting element 1041 in the first group corresponding to the second group are both electrically connected to a same one of multiple driving elements 1031.

For example, as illustrated in FIG. 3, the display screen may include three first light-emitting elements 1041 and twelve second light-emitting elements 1042. The three first light-emitting elements 1041 may be divided into three first groups 201 and each group 201 may include one first light-emitting element 1041. The twelve second light-emitting elements 1042 may be divided into three second groups 202 and each group 202 may include four second light-emitting elements 1042. As illustrated in FIG. 3, the second light-emitting elements 1042 in each second group 202 and the first light-emitting element 1041 in the first group 201 corresponding to the second group 202 are both electrically connected to the same one of the multiple driving elements 1031 through the corresponding first electrodes 105, and a first light-emitting group 203, a second light-emitting group 204, and a third light-emitting group 205 are formed respectively. In some embodiments, each of the first light-emitting group 203, the second light-emitting group 204, and the third light-emitting group 205 includes one driving element 1031, one first light-emitting element 1041, and three second light-emitting elements 1042 which are electrically connected through the first electrode 105. Therefore, the first light-emitting elements 1041 and the second light-emitting elements 1042 can be simultaneously driven by the driving elements 1031 arranged in the first region 101, and no driving element 1031 is required to be arranged in the second region 102. Thereby, the transparency of the second region 102 can be greatly increased, lighting of the device behind the second region 102 can be facilitated, formation of a via in the display screen can be avoided, the display effect of the second region 102 can also be achieved, no additional driving signal line and driving element 1031 are required to drive the second light-emitting elements 1042 to emit light, and the display screen is simple in structure.

In an embodiment, the first group 201 may further include multiple first light-emitting elements, and the multiple first light-emitting elements may be electrically connected to the same one of the multiple driving elements through the first electrode 105.

In an embodiment, the at least one second light-emitting element in each second group 202 and the at least one first light-emitting element in the first group 201 corresponding to the second group 202 may be connected in any one of the following manners: series connection, parallel connection or mixed connection. There are no limits made herein.

In an embodiment, the at least one second light-emitting element in each second group 202 has an emitting color, which may be the same as an emitting color of the at least one first light-emitting element in the first group 201 corresponding to the second group 202.

For example, as illustrated in FIG. 3, the emitting colors of the first light-emitting element 1041 and the second light-emitting elements 1042 in the first light-emitting group 203 may all be red. The emitting colors of the first light-emitting element 1041 and the second light-emitting elements 1042 in the second light-emitting group 204 may all be green. The emitting colors of the first light-emitting element 1041 and the second light-emitting elements 1042 in the third light-emitting group 205 may all be blue. Therefore, when the three first light-emitting elements 1041 form a pixel point, a display color of the second region 102 may be the same as a display color of the pixel point formed by the three first light-emitting elements 1041.

In an embodiment, the at least one second light-emitting element 1042 in each second group 202 may have a first set of one or more emitting colors, the at least one first light-emitting element 1041 in the first group 201 corresponding to the second group 202 may have a second set of one or more emitting colors, the first set and the second set may have an overlap or have no overlap. For example, in the first light-emitting group 203, the emitting color of the first light-emitting element 1041 may be set to red and the emitting colors of three second light-emitting elements 1042 may be set to blue. For another example, in the second light-emitting group 204, the emitting color of the first light-emitting element 1041 may be set to blue, and the emitting colors of the three second light-emitting elements 1042 may be set to red, green and blue respectively. Similarly, different color combinations may be set according to a display requirement to achieve a specified display effect. There are no limits made to the emitting colors of the first light-emitting elements 1041 and the second light-emitting elements 1042 in the present disclosure. Accordingly, variable colors can be displayed in the second region 102 only by adjusting the emitting colors of the first light-emitting elements 1041 and the second light-emitting elements 1042 without additionally providing the driving elements 1031 for the second light-emitting elements 1042.

It is to be noted that the emitting colors of the first light-emitting elements 1041 and the second light-emitting elements 1042 may be adjusted in a proper manner according to needs. For example, optical filters of different colors are adopted or different luminescent materials are adopted. There are no limits made to a method for adjusting the emitting color in the present disclosure.

In an embodiment, the at least one second light-emitting element 1042 in each second group 202 and the at least one first light-emitting element 1041 in the first group 201 corresponding to the second group 202 may be arranged in a straight line, a polyline, a curve or an array. For example, as illustrated in FIG. 3, the second light-emitting elements 1042 in each second group 202 and the first light-emitting element 1041 in the first group 201 corresponding to the second group 202 are arranged in a straight line. It is to be noted that other forms of arrangement may be selected according to needs and there are no limits made herein.

In an embodiment, each of the one or more first light-emitting elements 1041 may be opposite to one of the one or more driving elements 1031, that is electrically connected to the first light-emitting element 1041, in the second direction. As illustrated in FIG. 1, the driving element 1031 is located below the first light-emitting element 1041 electrically connected thereto. Accordingly, a length of a connecting wire between the first light-emitting element 1041 and the driving element 1031 can be effectively reduced, thereby reduction in signal noise and power loss can be facilitated, and material cost can be reduced.

Figure 4:
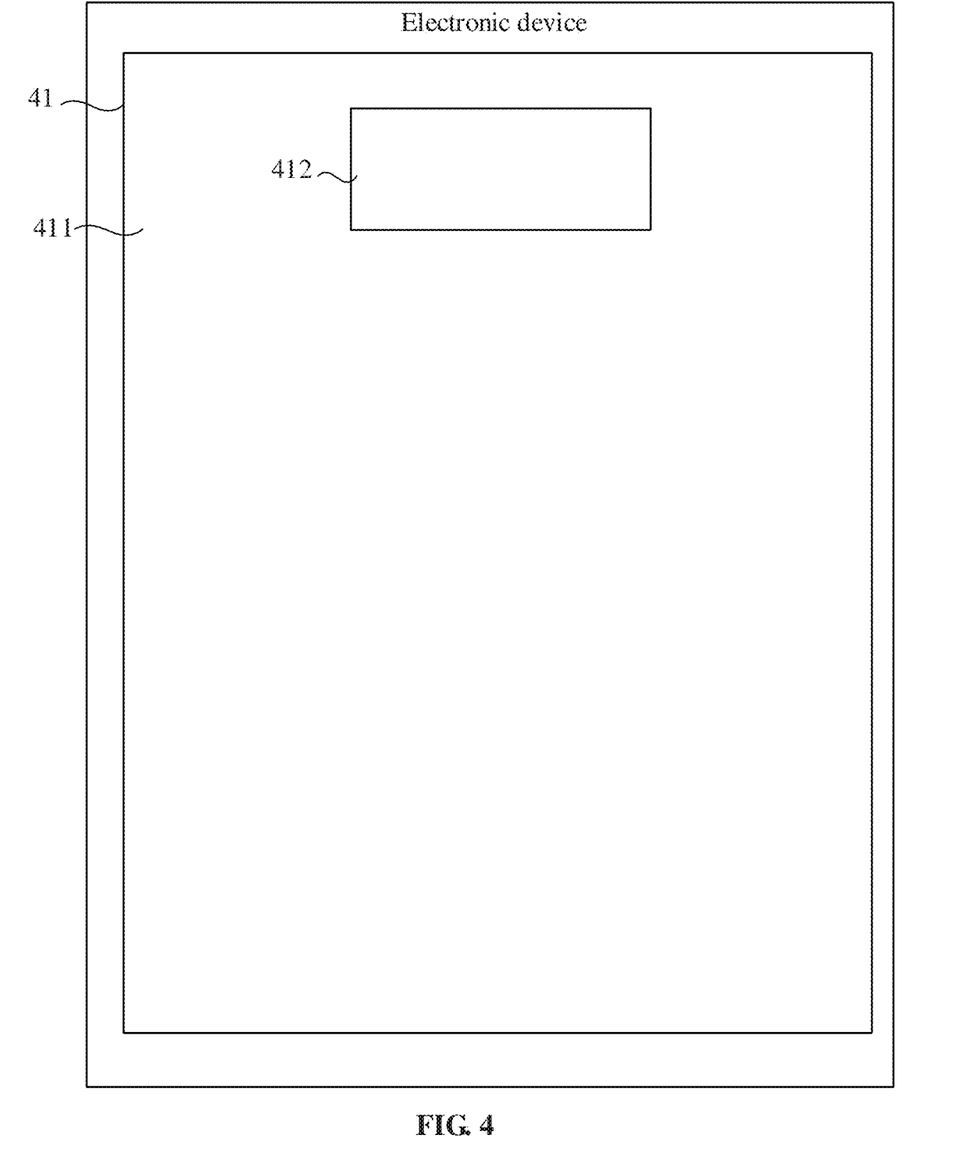
FIG. 4 is a schematic diagram illustrating an electronic device according to an exemplary embodiment.

FIG. 4 is a schematic diagram illustrating an electronic device according to an exemplary embodiment. The electronic device may be, for example, a terminal device such as a mobile phone, a tablet computer, a smart watch and a notebook computer. There are no limits made herein. As illustrated in FIG. 4, the electronic device may include an OLED display screen 41, which may be any of the above described OLED display screens.

In an embodiment, a first region 411 may display a multimedia picture such as an image and a video, and a second region 412 may have a certain transparency and a display function. For example, an optical device (not shown) such as a camera may be arranged in a position, corresponding to the second region 412, of a panel of the electronic device, so that the optical device may acquire incident light penetrating the second region 412 of the display screen and then perform operations such as image and video shooting, recognition unlocking. According to the present disclosure, the display screen includes, in the first direction, the first region and the second region. The first film layer in the first region of the display screen is provided with one or more driving elements, and the first film layer in the second region of the display screen is provided with no driving element. One or more first light-emitting elements arranged in the first region and one or more second light-emitting elements arranged in the second region are driven by the one or more driving elements in the first region. Therefore, no driving element is required to be arranged in the second region, thereby transparency of the second region can be greatly increased, lighting of a device behind the second region can be facilitated, formation of a via in the display screen can be avoided, a display effect of the second region can also be achieved, no additional driving signal line and driving element are required to drive the one or more second light-emitting elements to emit light, and the display screen is simple in structure.

Other embodiments of the present disclosure will be apparent to those skilled in the art by considering the specification and implementing the present disclosure. The present disclosure is intended to cover any variation, use, or adaptation of the present disclosure following the general principles thereof and including common knowledge or conventional technical means in the art that are not disclosed in the present disclosure. The specification and embodiments are considered as exemplary only, and a true scope and spirit of the present disclosure are indicated by the following claims.

It will be understood that the present disclosure is not limited to the accurate structures that have been described above and illustrated in the accompanying drawings, and various modifications and changes may be made without departing from the scope thereof. The scope of the present disclosure is only limited by the appended claims.

What is claimed is:

1. An organic light-emitting diode (OLED) display screen, comprising:
   in a first direction, a first region and a second region; and
   in a second direction perpendicular to the first direction, a first film layer, a first electrode, a second film layer, and a second electrode which are sequentially overlaid on the first film layer, wherein:
   the first film layer in the first region of the OLED display screen is provided with one or more driving elements, and the first film layer in the second region of the OLED display screen is provided with no driving element;
   one or more first light-emitting elements are arranged in the second film layer in the first region of the OLED display screen, one or more second light-emitting elements are arranged in the second film layer in the second region of the OLED display screen, and the one or more first light-emitting elements and the one or more second light-emitting elements are driven by the one or more driving elements to emit light, wherein each one of the one or more first light-emitting elements is disposed directly above a driving element electrically connected to the first light-emitting element;
   the one or more first light-emitting elements and the one or more second light-emitting elements are electrically connected to the one or more driving elements through the first electrode; and
   the one or more first light-emitting elements and the one or more second light-emitting elements are electrically connected to the second electrode,
   wherein the one or more first light-emitting elements comprise a plurality of first light-emitting elements, the one or more second light-emitting elements comprise a plurality of second light-emitting elements, and the one or more driving elements comprise a plurality of driving elements;
   the plurality of first light-emitting elements are divided into a plurality of first groups, and each of the plurality of first groups comprises at least one of the plurality of first light-emitting elements;
   the plurality of second light-emitting elements are divided into a plurality of second groups, and each of the plurality of second groups comprises at least one of the plurality of second light-emitting elements;
   each second group corresponds to a respective one of the first groups; and
   the at least one second light-emitting element in each second group and the at least one first light-emitting element in the first group corresponding to the second group are electrically connected to a same one of the plurality of driving elements.

2. The OLED display screen of claim 1, wherein the at least one second light-emitting element in each of the second groups has an emitting color, which is the same as an emitting color of the at least one first light-emitting element in the first group corresponding to the second group.

3. The OLED display screen of claim 1, wherein the at least one second light-emitting element in each of the second groups has a first set of one or more emitting colors, the at least one first light-emitting element in the first group corresponding to the second group has a second set of one or more emitting colors, the first set and the second set have an overlap or have no overlap.

4. The OLED display screen of claim 1, wherein the at least one second light-emitting element in each of the second groups and the at least one first light-emitting element in the first group corresponding to the second group are arranged in one of a straight line, a polyline, a curve, or an array.

5. The OLED display screen of claim 1, wherein the first electrode is an anode and the second electrode is a cathode.

6. The OLED display screen of claim 1, wherein each of the one or more first light-emitting elements is opposite to one of the one or more driving elements, which is electrically connected to the first light-emitting element, in the second direction.

7. The OLED display screen of claim 1, wherein a material of the first film layer in the first region of the OLED display screen is different from a material of the first film layer in the second region of the OLED display screen.

8. The OLED display screen of claim 1, wherein a via is formed at the first film layer in the second region of the OLED display screen.

9. The OLED display screen of claim 1, wherein the first electrode and the second electrode are made of transparent conducting materials.

10. An electronic device, comprising an organic light-emitting diode (OLED) display screen, wherein the OLED display screen comprises, in a first direction, a first region and a second region and, in a second direction perpendicular to the first direction, a first film layer, and a first electrode, a second film layer, and a second electrode which are sequentially overlaid on the first film layer, wherein:
   the first film layer in the first region of the OLED display screen is provided with one or more driving elements, and the first film layer in the second region of the OLED display screen is provided with no driving element;
   one or more first light-emitting elements are arranged in the second film layer in the first region of the OLED display screen, one or more second light-emitting elements are arranged in the second film layer in the second region of the OLED display screen, and the one or more first light-emitting elements and the one or more second light-emitting elements are driven by the one or more driving elements to emit light, wherein each one of the one or more first light-emitting elements is disposed directly above a driving element electrically connected to the first light-emitting element;

the one or more first light-emitting elements and the one or more second light-emitting elements are electrically connected to the one or more driving elements through the first electrode; and the one or more first light-emitting elements and the one or more second light-emitting elements are electrically connected to the second electrode, wherein the one or more first light-emitting elements comprise a plurality of first light-emitting elements, the one or more second light-emitting elements comprise a plurality of second light-emitting elements, and the one or more driving elements comprise a plurality of driving elements;

the plurality of first light-emitting elements are divided into a plurality of first groups, and each of the plurality of first groups comprises at least one of the plurality of first light-emitting elements;

the plurality of second light-emitting elements are divided into a plurality of second groups, and each of the plurality of second groups comprises at least one of the plurality of second light-emitting elements;

each second group corresponds to a respective one of the first groups; and the at least one second light-emitting element in each second group and the at least one first light-emitting element in the first group corresponding to the second group are electrically connected to a same one of the plurality of driving elements.

11. The electronic device of claim 10, wherein the at least one second light-emitting element in each of the second groups has an emitting color, which is the same as an emitting color of the at least one first light-emitting element in the first group corresponding to the second group.

12. The electronic device of claim 10, wherein the at least one second light-emitting element in each of the second groups has a first set of one or more emitting colors, the at least one first light-emitting element in the first group corresponding to the second group has a second set of one or more emitting colors, the first set and the second set have an overlap or have no overlap.

13. The electronic device of claim 10, wherein the at least one second light-emitting element in each of the second groups and the at least one first light-emitting element in the first group corresponding to the second group are arranged in one of a straight line, a polyline, a curve, or an array.

14. The electronic device of claim 10, wherein the first electrode is an anode and the second electrode is a cathode.

15. The electronic device of claim 10, wherein each of the one or more first light-emitting elements is opposite to one of the one or more driving elements, which is electrically connected to the first light-emitting element, in the second direction.

16. The electronic device of claim 10, wherein a via is formed at the first film layer in the second region of the OLED display screen.

17. The electronic device of claim 10, wherein the first electrode and the second electrode are made of transparent conducting materials.

* * * * *